(12) United States Patent
Kim et al.

(10) Patent No.: US 7,259,392 B2
(45) Date of Patent: Aug. 21, 2007

(54) ORGANIC THIN FILM TRANSISTOR ARRAY PANEL AND MANUFACTURING METHOD THEREOF

(75) Inventors: Bo-Sung Kim, Seoul (KR); Min-Seong Ryu, Gyeonggi-do (KR); Mun-Pyo Hong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 22 days.

(21) Appl. No.: 11/186,233

(22) Filed: Jul. 20, 2005

(65) Prior Publication Data
US 2006/0131586 A1    Jun. 22, 2006

(30) Foreign Application Priority Data
Dec. 17, 2004   (KR)   ................ 10-2004-0108171

(51) Int. Cl.
*H01L 51/40*   (2006.01)
(52) U.S. Cl. ........................................... 257/40; 349/52

(58) Field of Classification Search .............. 257/40; 349/44, 47, 52
See application file for complete search history.

(56) References Cited

U.S. PATENT DOCUMENTS

2002/0128515 A1* 9/2002 Ishida et al. ............ 564/435

* cited by examiner

*Primary Examiner*—Thomas L. Dickey
(74) *Attorney, Agent, or Firm*—F. Chau & Associates LLP

(57) ABSTRACT

A method of manufacturing a thin film transistor array panel is provided, the method includes: a substrate; a data line disposed on the substrate; an interlayer insulating layer disposed on the data line; a gate line disposed on the interlayer insulating layer and including a gate electrode; a gate insulating layer disposed on the gate line and the interlayer insulating layer, the gate insulating layer and the interlayer insulating film having a contact hole exposing the data line; a first electrode disposed on the gate insulating layer and connected to the data line through the contact hole; a second electrode disposed opposite the first electrode with respect to the gate electrode; an organic semiconductor disposed on the first and the second electrodes and contacting the first and the second electrodes; and a passivation member disposed on the organic semiconductor.

14 Claims, 14 Drawing Sheets

ORGANIC THIN FILM TRANSISTOR ARRAY PANEL AND MANUFACTURING METHOD THEREOF

BACKGROUND OF THE INVENTION (a) Field of the Invention

The present invention relates to an organic thin film transistor array panel and a manufacturing method thereof.

(b) Description of Related Art

Electric field effect transistors including organic semiconductors have been vigorously researched as driving devices for next generation display devices.

Organic semiconductors may be classified into low molecule compounds such as oligothiophene, pentacene, phthalocyanine, and $C_6O$; and high molecule compounds such as polythiophene and polythienylenevinylene.

The low molecule semiconductors have a high mobility in a range of about 0.05–1.5 msV, and superior on/off current ratios. However, conventional processes for manufacturing organic thin film transistors (TFTs), including low molecule semiconductor compounds, can be complicated in that they require a low molecule semiconductor pattern be formed by using a shadow mask and vacuum deposition in order to avoid solvent-induced, in-plane expansion caused by organic solvents.

On the contrary, the organic thin film transistors based on the high molecular weight semiconductor materials show rather a low mobility in a range of about 0.001–0.1 $cm^2/Vs$ even though they have a merit for mass production due to their solution processibility, such as coating and inkjet printing process.

In addition, the organic semiconductor has a tendency to change its characteristics or to be damaged due to subsequent processing, thereby deteriorating the characteristics of organic TFTs.

SUMMARY OF THE INVENTION

A method of manufacturing a thin film transistor array panel is provided, the method includes: a substrate; a data line disposed on the substrate; an interlayer insulating layer disposed on the data line; a gate line disposed on the interlayer insulating layer and including a gate electrode; a gate insulating layer disposed on the gate line and the interlayer insulating layer, the gate insulating layer and the interlayer insulating film having a contact hole exposing the data line; a first electrode disposed on the gate insulating layer and connected to the data line through the contact hole; a second electrode disposed opposite the first electrode with respect to the gate electrode; an organic semiconductor disposed on the first and the second electrodes and contacting the first and the second electrodes; and a passivation member disposed on the organic semiconductor.

The first and the second electrodes may include indium tin oxide (ITO) and the second electrode may include a pixel electrode.

The organic thin film transistor array panel may further include an insulator disposed between the organic semiconductor and the passivation member. The insulator may include hydrocarbon based polymer including fluorine or parylene.

The interlayer insulating film may include silicon nitride (SiNx), polyacryl, polyimide, or benzocyclobutene.

The gate insulating layer may include at least one selected from the group consisting of silicon dioxide, silicon nitride, maleimide-styrene, polyvinylphenol (PVP), and modified cyanoethyl pullulan (m-CEP).

The organic semiconductor may include at least one selected from the group consisting of: tetracene, pentacene, and derivatives thereof with substituent; oligothiophene including four to eight thiophenes connected at the positions 2, 5 of thiophene rings; perylenetetracarboxylic dianhydride (PTCDA), naphthalenetetracarboxylic dianhydride (NTCDA), and imide derivatives thereof; metallized phthalocyanine and halogenated derivatives thereof; co-oligomer and co-polymer of thienylene and vinylene; regioregular polythiophene; perylene, coronene, and derivatives thereof with substituent; and aromatic and heteroaromatic ring of the above-described materials with at least one hydrocarbon chain having one to thirty carbon atoms.

A method for manufacturing an organic thin film transistor array panel is provided, which includes: forming a data line on a substrate; forming an interlayer insulating film on the data line; forming a gate line including on the interlayer insulating film; forming a gate insulating layer on the gate line and the interlayer insulating film, the gate insulating layer and the interlayer insulating film having a contact hole exposing the data line; forming first and second electrodes on the gate insulating layer, the first electrode connected to the data line through the contact hole and the second electrode separated from the first electrode; forming an organic semiconductor contacting the first and the second electrodes; and forming a passivation member on the organic semiconductor.

The method may further include: forming an insulator on the organic semiconductor and under the passivation member.

The first and the second electrodes may include ITO.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

An organic TFT array panel according to an embodiment of the present invention will be described in detail with reference to FIGS. 1 and 2.

Figure 1:
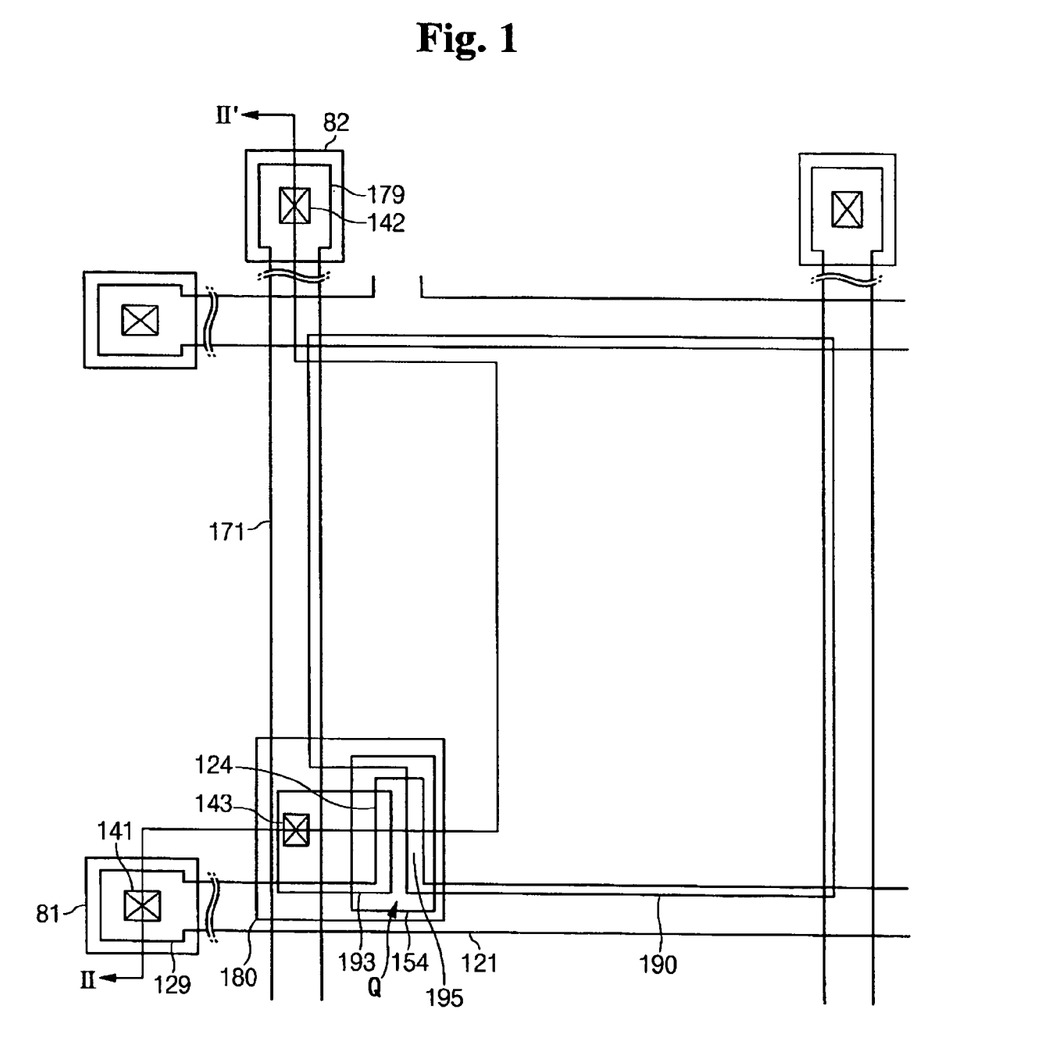
FIG. 1 is a layout view of an organic TFT array panel according to an embodiment of the present invention.
Figure 2:
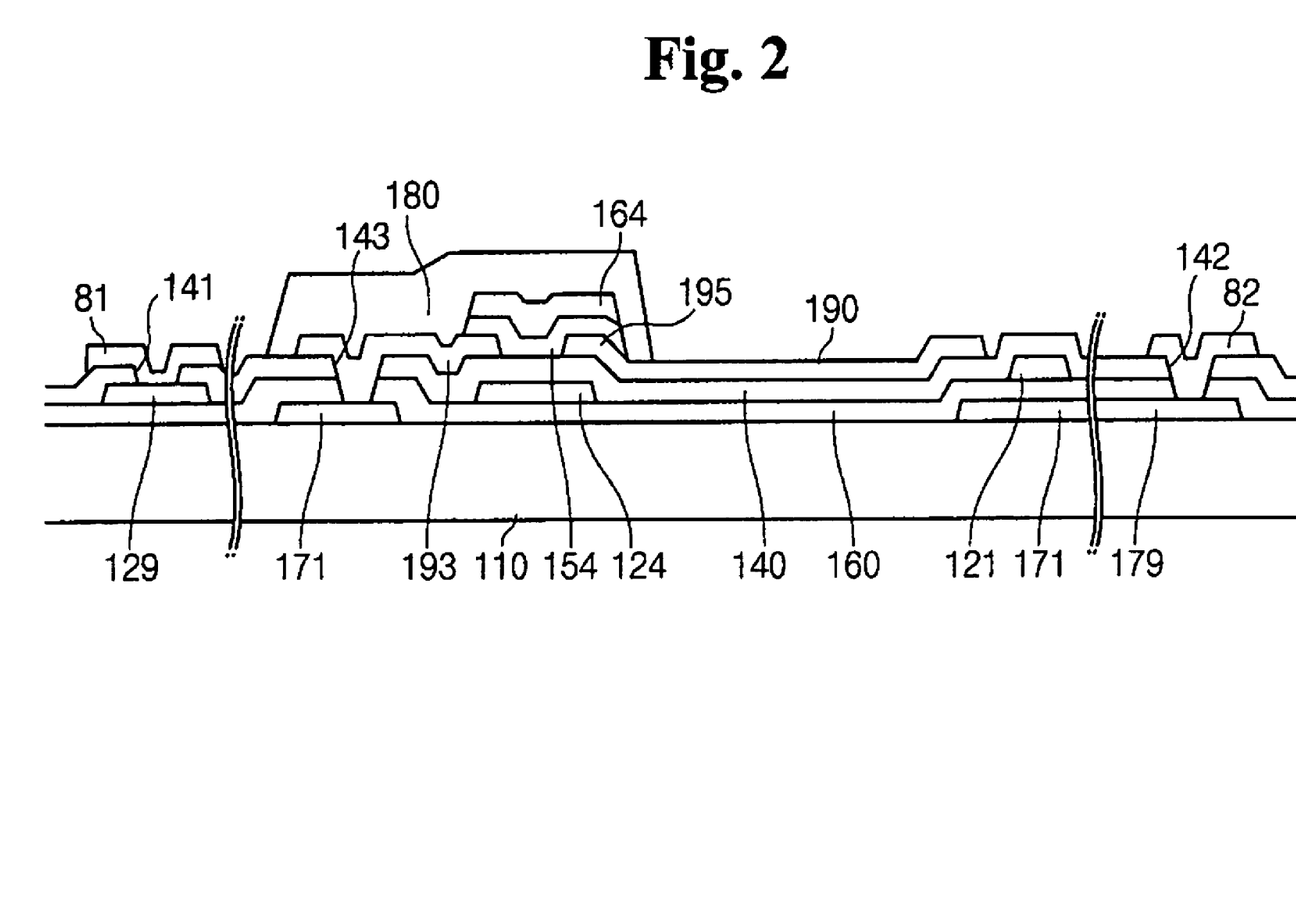
FIG. 2 is a cross-sectional view of the organic TFT array panel shown in FIG. 1 taken along the line II-II'.

FIG. 1 is a layout view of an organic TFT array panel according to an embodiment of the present invention and FIG. 2 is a cross-sectional view of the organic TFT array panel shown in FIG. 1 taken along the lines II-II'.

A plurality of data lines 171 are formed on an insulating substrate 110 such as transparent glass, silicone, or plastic.

The data lines 171 transmit data signals and extend substantially in the longitudinal direction. Each data line 171 includes an end portion 179 having a large area for contact with another layer or an external driving circuit. A data driving circuit (not shown) for generating the data signals may be mounted on a flexible printed circuit (FPC) film (not shown), which may be attached to the substrate 110, directly mounted on the substrate 110, or integrated onto the substrate 110. The data lines 171 may extend to be connected to a driving circuit that may be integrated on the substrate 110.

The data lines 171 are preferably made of Al containing metal such as Al and Al alloy, Ag containing metal such as Ag and Ag alloy, Au containing metal such as Au and Au alloy, Cu containing metal such as Cu and Cu alloy, Mo containing metal such as Mo and Mo alloy, Cr, Ta or Ti. However, they may have a multi-layered structure including two conductive films (not shown) having different physical characteristics. One of the two films is preferably made of low resistivity metal including Al containing metal, Ag containing metal, and Cu containing metal for reducing signal delay or voltage drop. The other film is preferably made of material such as Mo containing metal, Cr, Ta, or Ti, which has good physical, chemical, and electrical contact characteristics with other materials such as indium tin oxide (ITO) or indium zinc oxide (IZO). Good examples of the combination of the two films are a lower Cr film and an upper Al (alloy) film and a lower Al (alloy) film and an upper Mo (alloy) film. However, the data lines 171 may be made of various metals or conductors.

The data lines 171 have inclined edge profiles, and the inclination angles thereof range about 30–80 degrees.

An interlayer insulating film 160 is formed on the data lines 171. The interlayer insulating film 160 may be made of inorganic insulator or organic insulator. Examples of the inorganic insulator include silicon nitride (SiNx) and silicon oxide (SiOx). Examples of the organic insulator include polyacryl, polyimide, and benzocyclobutene (BCB; $C_{10}H_8$).

A plurality of gate lines 121 are formed on the interlayer insulating film 160.

The gate lines 121 transmit gate signals and extend substantially in a transverse direction. Each gate line 121 includes a plurality of gate electrodes 124 projecting upward and an end portion 129 having a large area for contact with another layer or an external driving circuit. A gate driving circuit (not shown) for generating the gate signals may be mounted on a FPC film (not shown), which may be attached to the substrate 110, directly mounted on the substrate 110, or integrated onto the substrate 110. The gate lines 121 may extend to be connected to a driving circuit that may be integrated on the substrate 110.

The gate lines 121 are preferably made of Al containing metal, Ag containing metal, Au containing metal, Cu containing metal, Mo containing metal, Cr, Ta, or Ti. However, they may have a multi-layered structure including two conductive films (not shown) having different physical characteristics. One of the two films is preferably made of low resistivity metal including Al containing metal, Ag containing metal, and Cu containing metal for reducing signal delay or voltage drop. The other film is preferably made of material such as Mo containing metal, Cr, Ta or Ti, which has good physical, chemical, and electrical contact characteristics with other materials such as ITO or IZO. Good examples of the combination of the two films are a lower Cr film and an upper Al (alloy) film and a lower Al (alloy) film and an upper Mo (alloy) film. However, the gate lines 121 may be made of various metals or conductors.

The lateral sides of the gate lines 121 are inclined relative to a surface of the substrate 110, and the inclination angle thereof ranges about 30–80 degrees.

A gate insulating layer 140 is formed on the gate lines 121. The interlayer insulating film 160 may be made of inorganic insulator or organic insulator. Examples of the inorganic insulator include silicon nitride and silicon oxide that may have a surface treated with octadecyl-trichlorosilane (OTS). Examples of the organic insulator include hydrocarbon based polymer including fluorine and parylene that can be deposited by chemical vapor deposition (CVD) in vacuum. Other examples of the organic insulator include maleimide-styrene, polyvinylphenol (PVP), and modified cyanoethyl pullulan (m-CEP).

Parylene shows excellent coating uniformity and great thickness varieties ranging from about 1,000 Å to several microns. Furthermore, parylene has very low permittivity to serve as an excellent insulator. Polymerized parylene is insoluble to almost all available organic solvents and has excellent chemical resistance. Since parylene can be deposited at room temperature, it gives no heat stress. Parylene is environment friendly since it is dry processed without solvent. Moreover, parylene requires no additive and thus there is no generated gas. In addition, the process for forming parylene film is simple to realize low manufacturing cost.

The gate insulating layer 140 has a plurality of contact holes 141 exposing the end portions 129 of the gate lines 121, and the gate insulating layer 140 and the interlayer insulating film 160 have a plurality of contact holes 142 and 143 exposing the end portions 179 of the data lines 171 and portions of the data lines 171, respectively.

A plurality of source electrodes 193, a plurality of pixel electrodes 190, and a plurality of contact assistants 81 and 82 are formed on the gate insulating layer 140. They are preferably made of ITO, particularly amorphous ITO. However, they may be other transparent conductor such as IZO or reflective conductor such as Ag, Al, or alloys thereof.

The source electrodes 193 are connected to the data lines 171 through the contact holes 143.

Each pixel electrode 190 includes a portion 195 disposed opposite a source electrode 193 with respect to a gate electrode 124, which is referred to as a drain electrode hereinafter. The pixel electrodes 190 overlap the gate lines 121 and the data lines 171 to increase the aperture ratio.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

A plurality of organic semiconductor islands 154 are formed on the source electrodes 193, the drain electrode 195, and the gate insulating layer 140. The semiconductor islands 154 are disposed on the gate electrodes 124 and contact the source electrodes 193 and the drain electrodes 195.

The organic semiconductor islands 154 may include a high molecular compound or a low molecular compound, which is soluble in an aqueous solution or organic solvent, and in this case, the organic semiconductor islands 154 can be formed by (inkjet) printing. However, the organic semiconductor islands 154 may be formed by deposition including spin coating and by lithography with or without etch and in this case, the partition 160 can be omitted.

The organic semiconductor islands 154 may be made of, or from derivatives of, tetracene or pentacene with substituent. Alternatively, the organic semiconductor islands 154 may be made of oligothiophene including four to eight thiophenes connected at the positions 2, 5 of thiophene rings.

The organic semiconductor islands 154 may be made of perylenetetracarboxylic dianhydride (PTCDA), naphthalenetetracarboxylic dianhydride (NTCDA), or their imide derivatives.

The organic semiconductor islands 154 may be made of metallized phthalocyanine or halogenated derivatives thereof. The metallized phthalocyanine may include Cu, Co, Zn, etc.

The organic semiconductor islands 154 may be made of co-oligomer or co-polymer of thienylene and vinylene. In addition, organic semiconductor islands 154 may be made of regioregular polythiophene.

The organic semiconductor islands 154 may be made of perylene, coronene or derivatives thereof with substituent.

The organic semiconductor islands 154 may be made of derivatives of aromatic or heteroaromatic ring of the above-described derivatives with at least one hydrocarbon chain having one to thirty carbon atoms.

A gate electrode 124, a source electrode 193, and a drain electrode 195 along with an organic semiconductor island 154 form an organic TFT Q having a channel formed in the organic semiconductor island 154 disposed between the source electrode 193 and the drain electrode 195.

The pixel electrodes 190 receive data voltages from the organic TFT Q and generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 190 and the common electrode form a capacitor referred to as a "liquid crystal capacitor," which stores applied voltages after the organic TFT turns off.

A plurality of stoppers 164 are formed on the organic semiconductor islands 154. The stoppers 164 have substantially the same planar shape as the organic semiconductor islands 154. The stoppers 164 are preferably made of insulating material that can be dry processed and deposited under low temperature. An example of such a material is hydrocarbon based polymer including fluorine or parylene that can be formed at room temperature or low temperature.

The stoppers 164 protect the organic semiconductor islands 154 from being damaged in the manufacturing process. The stoppers 164 may be omitted.

A plurality of passivation members 180 are formed on the organic TFTs Q and the stoppers 164. The passivation members 180 are preferably made of inorganic insulator such as silicon nitride or silicon oxide, organic insulator, or low dielectric insulator. The organic insulator and the low dielectric insulator preferably have dielectric constant less than about 4.0 and the low dielectric insulator includes a-Si:C:O and a-Si:O:F formed by plasma enhanced chemical vapor deposition (PECVD). The organic insulator for the passivation members 180 may have photosensitivity and the passivation members 180 may have a flat surface.

The operation of the above-described organic TFT will be described in detail.

The charge carriers, i.e., holes or electrons in the organic semiconductor islands 154 are uniformly distributed when no voltage is applied to the gate electrode 124 and there is no voltage difference between the source electrode 193 and the drain electrode 195. Upon the application of a voltage between the source electrode 193 and the drain electrode 195, an electrical current is generated in the organic semiconductor island 154 and the amount of the current is in proportion to the applied voltage when the applied voltage is small. Upon the application of a voltage to the gate electrode 124 (referred to as "gate voltage" hereinafter), the charge carriers move in response to an electric field generated by the gate voltage. Depending on the polarity of the gate voltage, the charge carriers move away from or close to the gate electrode 124 to form a depletion layer including no charge carrier or an accumulation layer full of charge carriers in the organic semiconductor island 154 near the gate insulator 140. Accordingly, the current flowing in the organic semiconductor island 154 can be controlled by controlling the magnitude and the polarity of the gate voltage.

Now, a method of manufacturing the TFT array panel shown in FIGS. 1 and 2 according to an embodiment of the present invention will be described in detail with reference to FIGS. 3–14 as well as FIGS. 1 and 2.

A method of manufacturing the organic TFT array panel shown in FIGS. 1 and 2 according to an embodiment of the present invention will be described with reference to FIGS. 3–12 as well as FIGS. 1 and 2.

Figure 3:
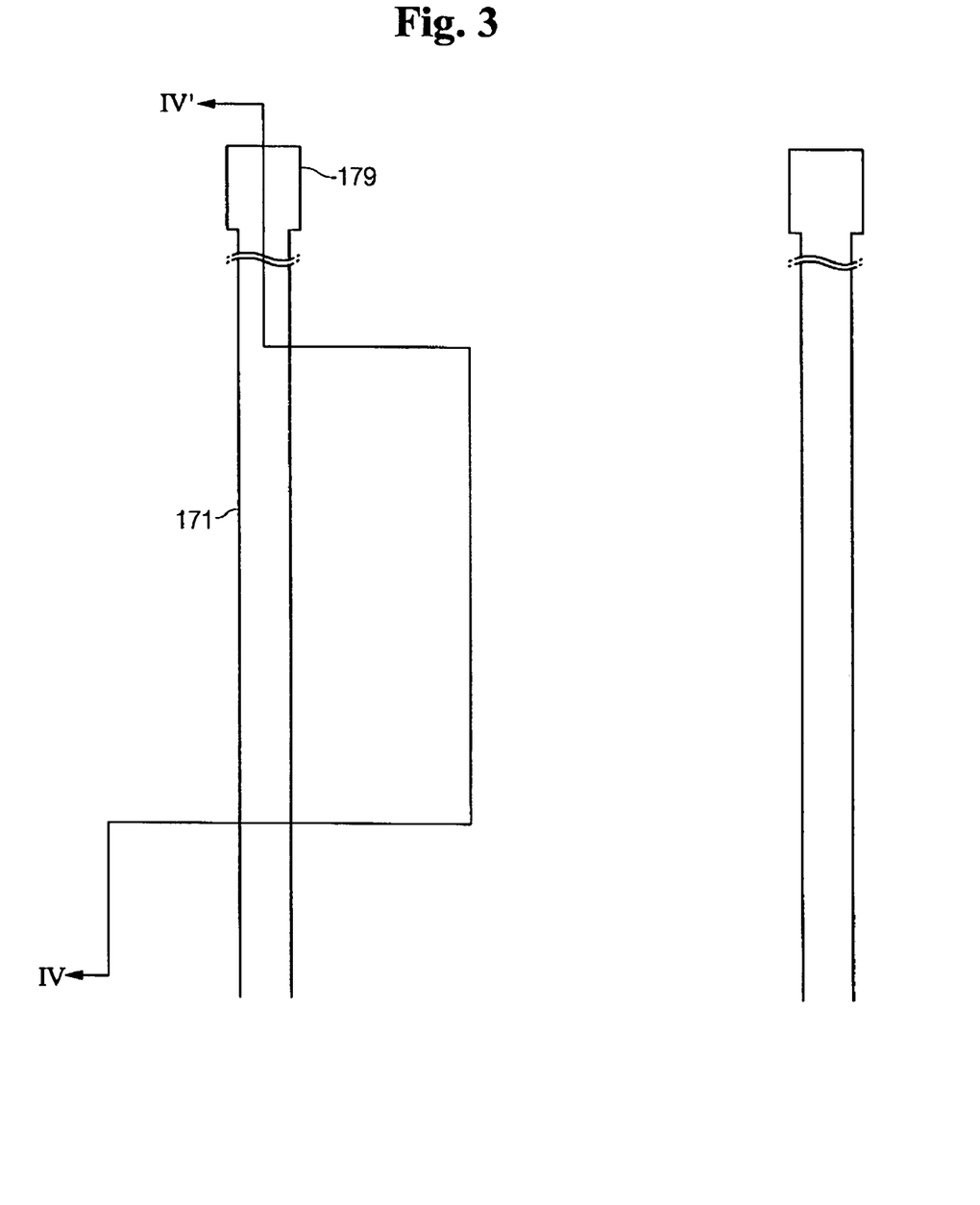
FIGS. 3, 5, 7, 9 and 11 are layout views of the organic TFT array panel shown FIGS. 1 and 2 in intermediate steps of a manufacturing method thereof according to an embodiment of the present invention.
Figure 4:
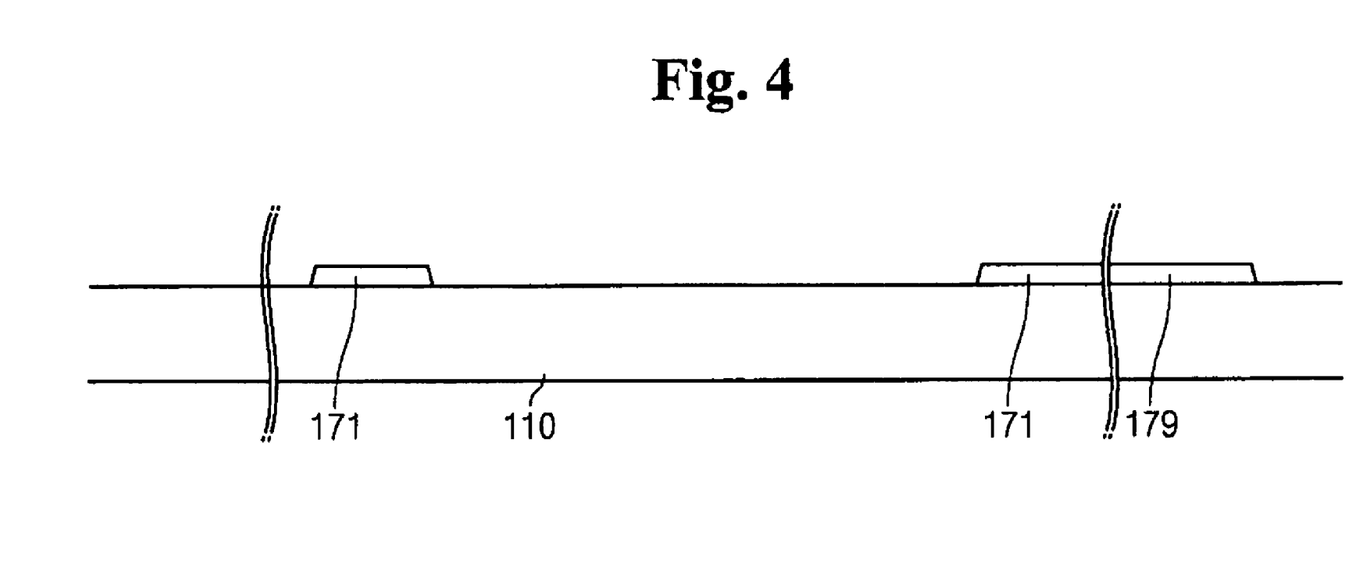
FIG. 4 is a cross-sectional view of the TFT array panel shown in FIG. 3 taken along line IV-IV'.
Figure 5:
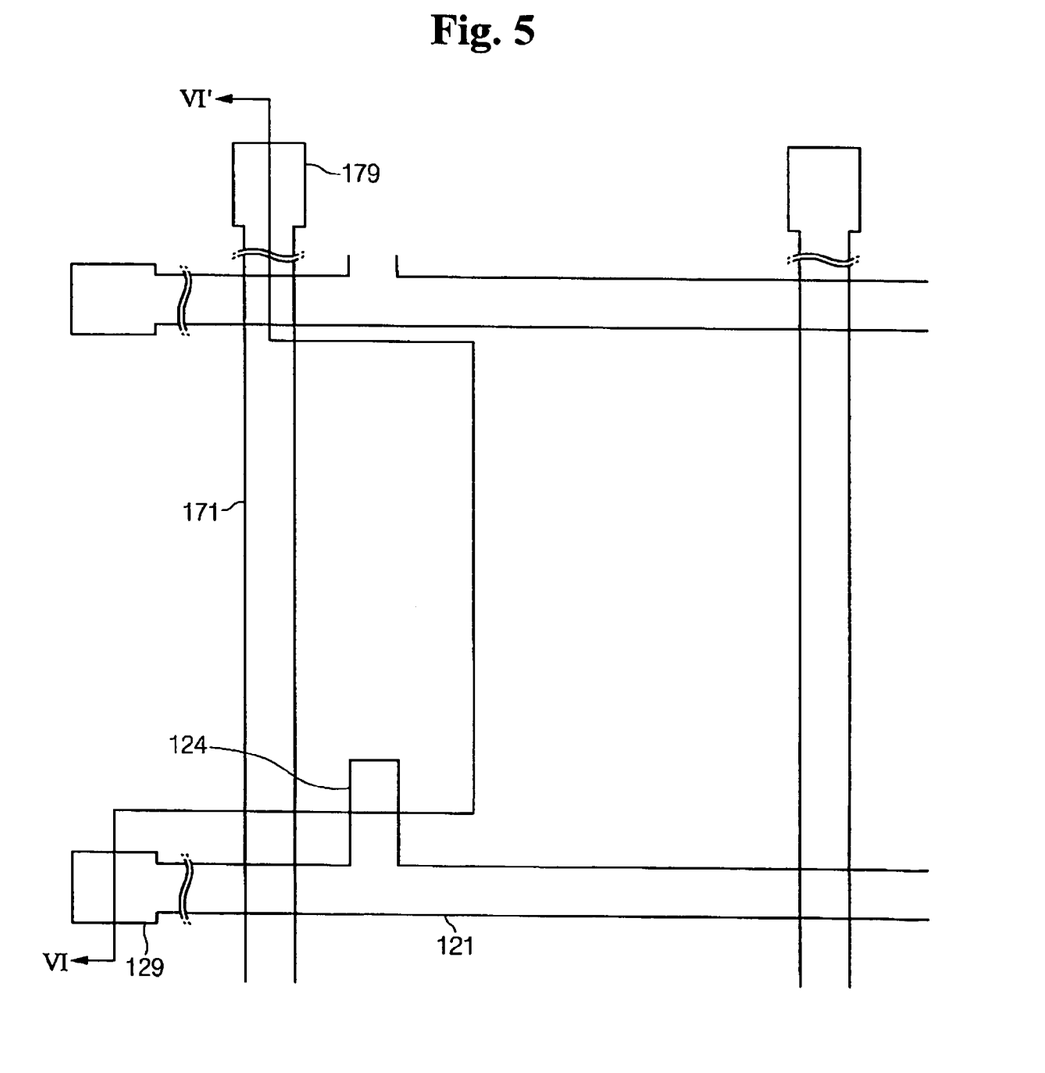
Figure 6:
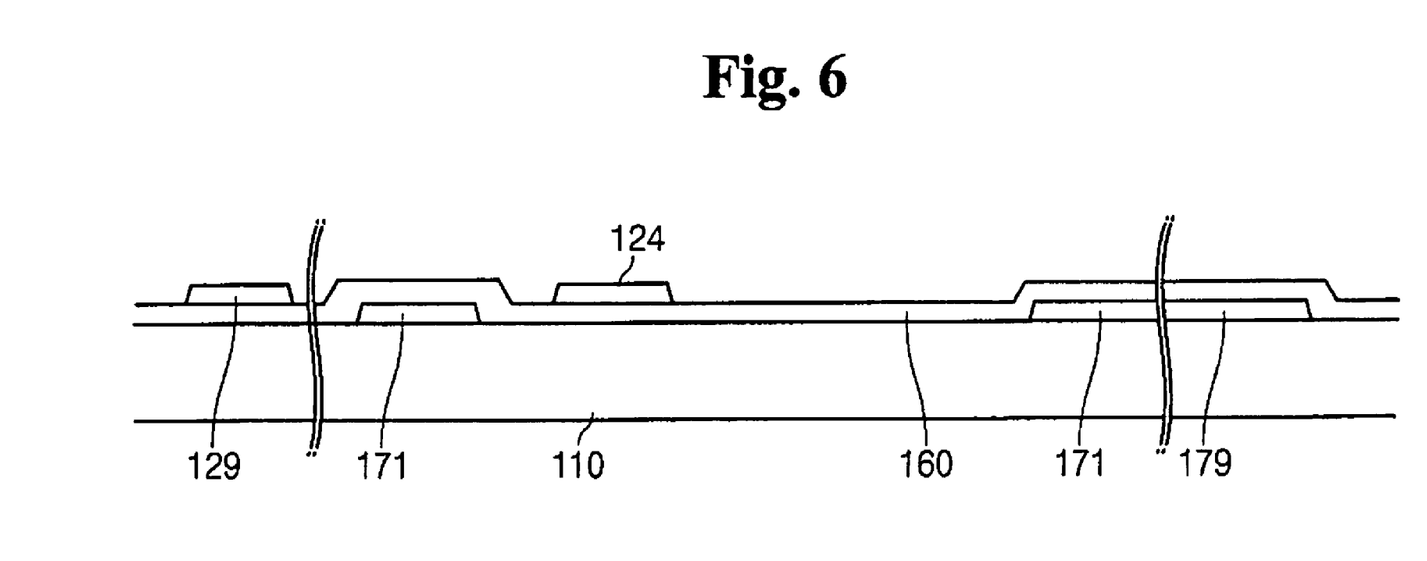
FIG. 6 is a cross-sectional view of the TFT array panel shown in FIG. 5 taken along line VI-VI'.
Figure 7:
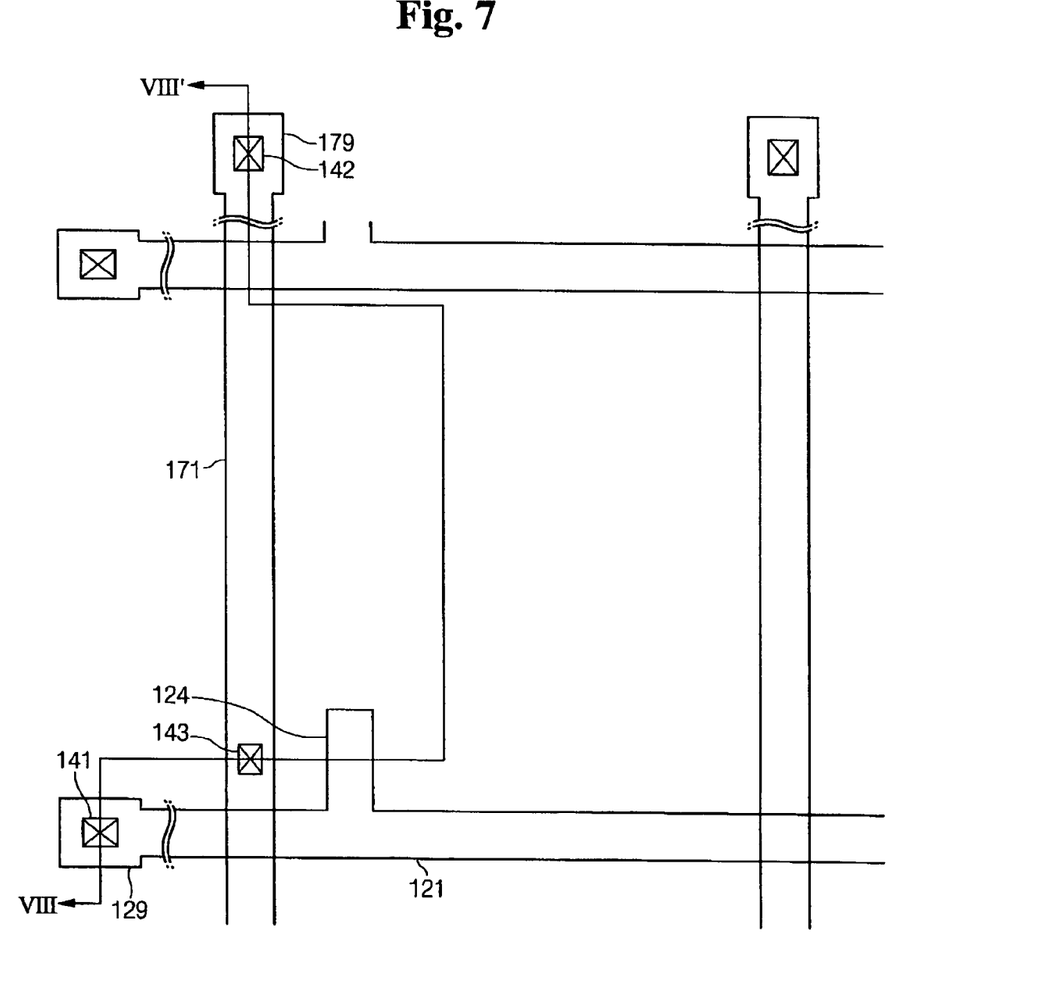
Figure 8:
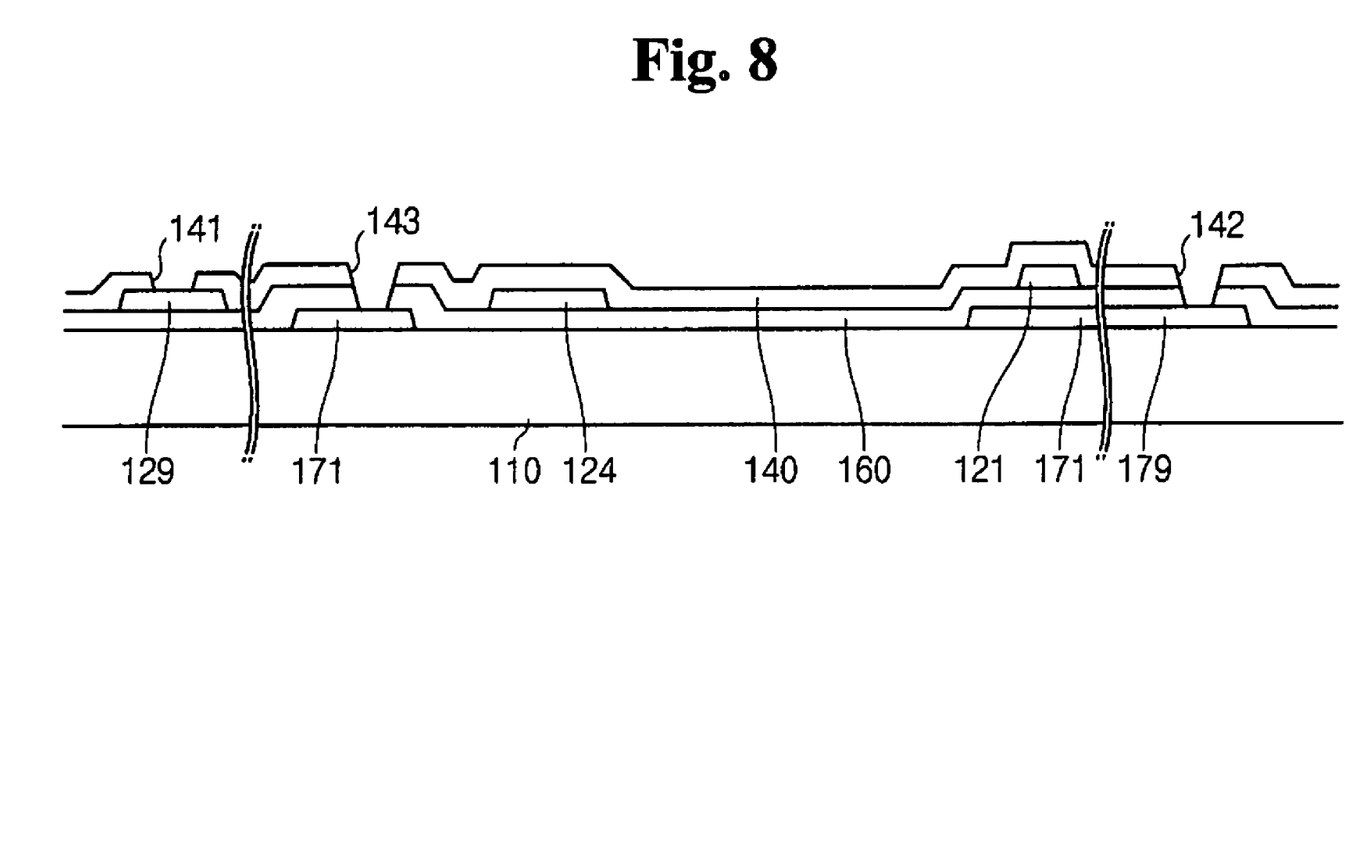
FIG. 8 is a cross-sectional view of the TFT array panel shown in FIG. 7 taken along line VIII-VIII'.
Figure 9:
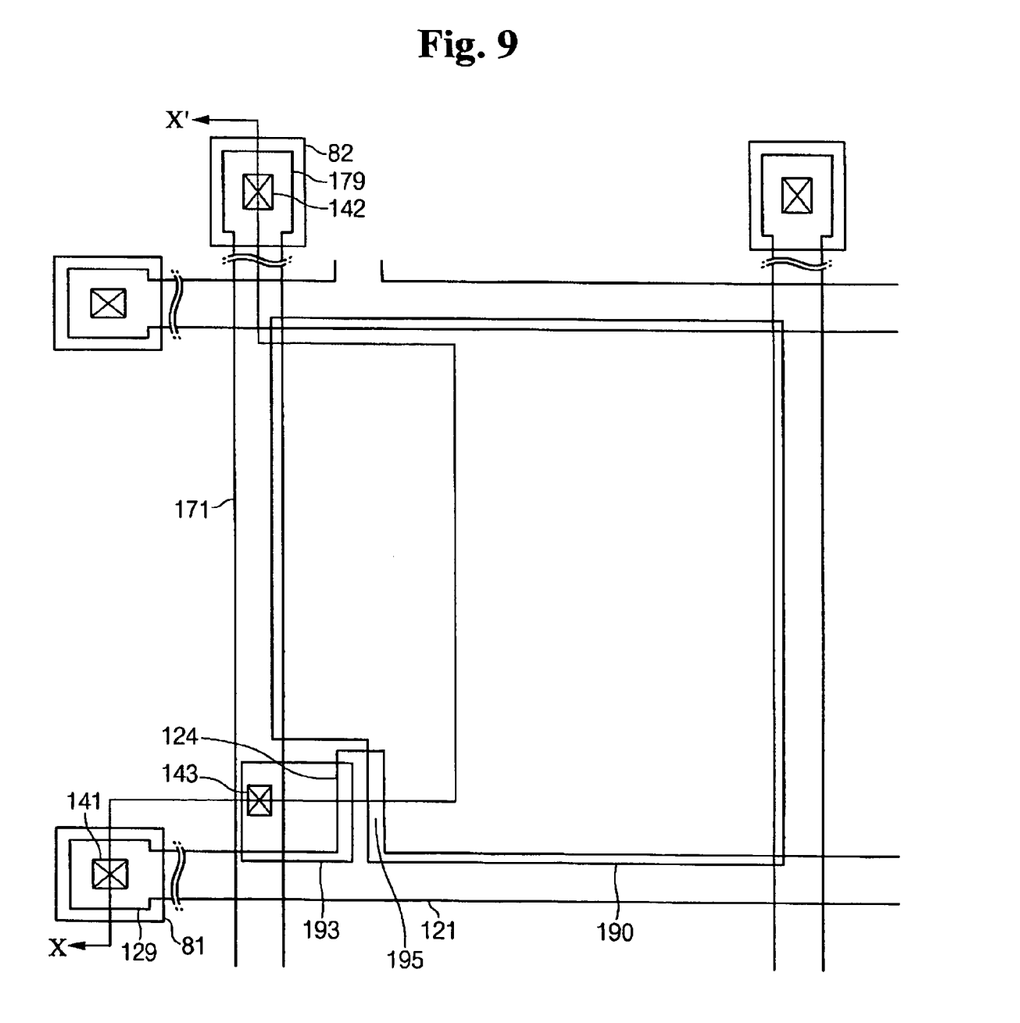
Figure 10:
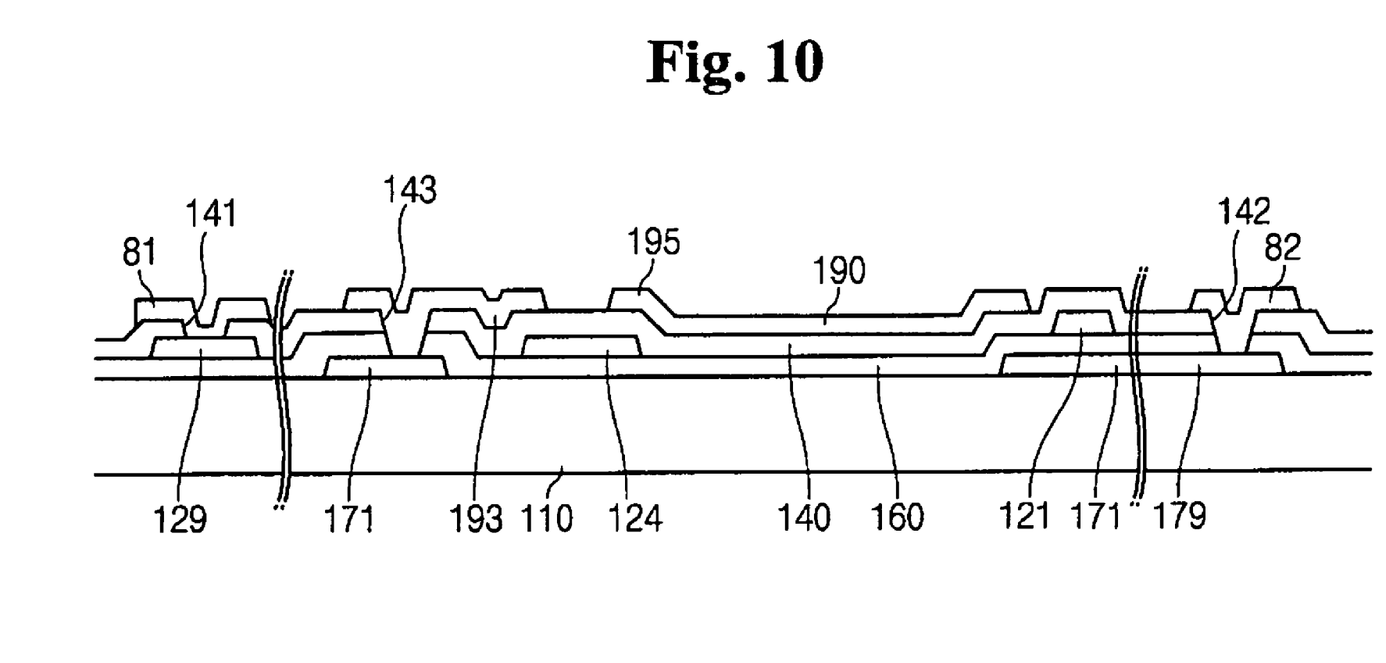
FIG. 10 is a cross-sectional view of the TFT array panel shown in FIG. 9 taken along line X-X'.
Figure 11:
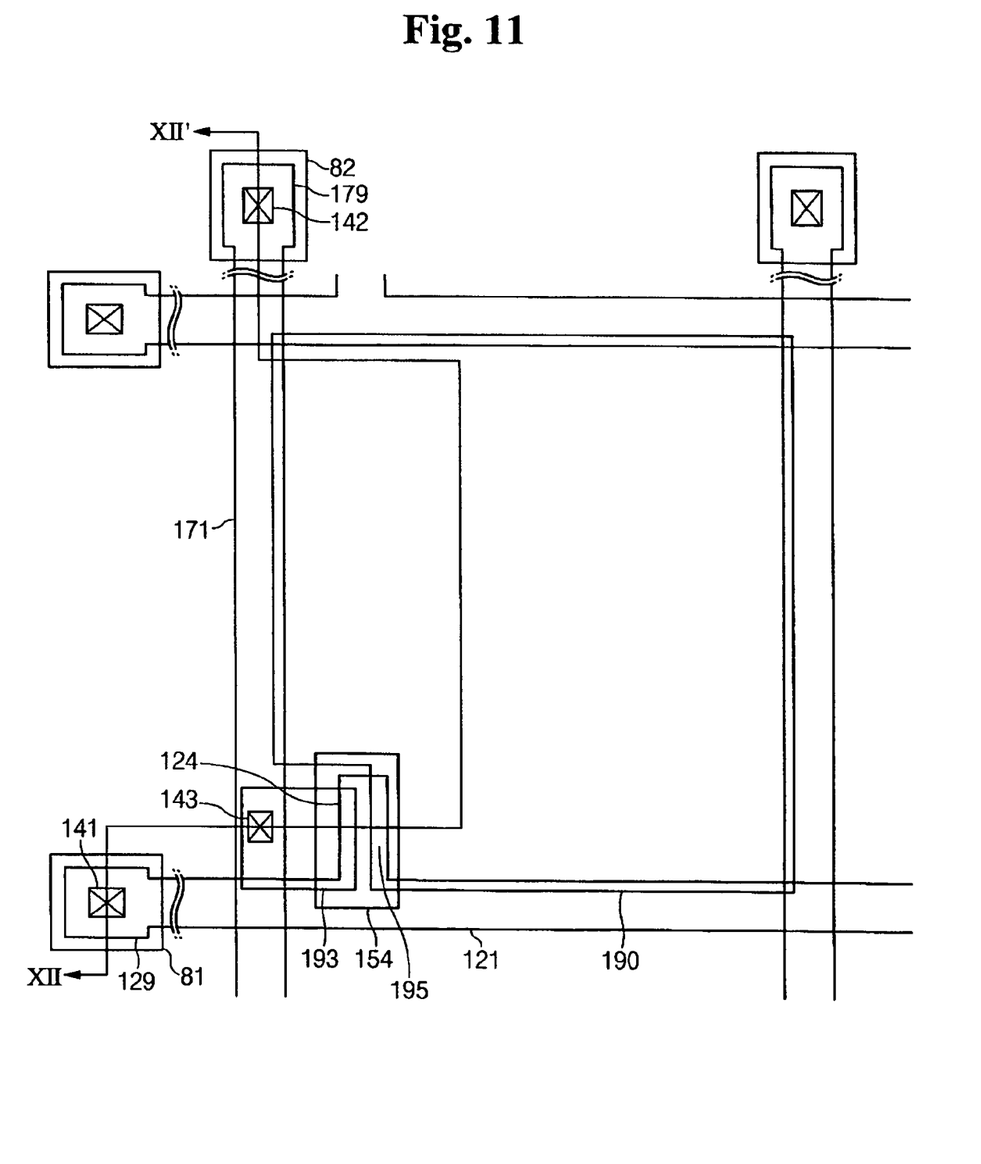
Figure 12:
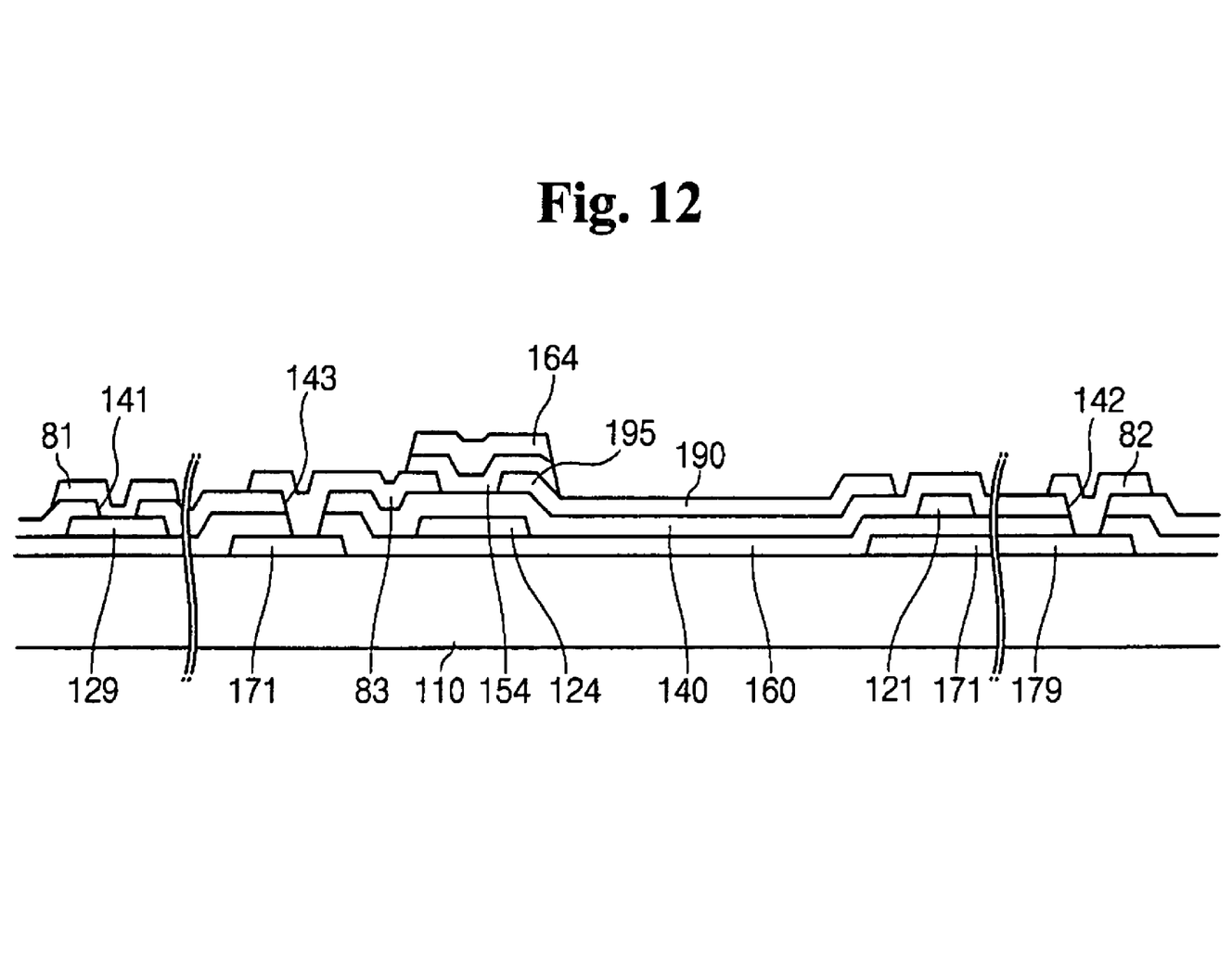
FIG. 12 is a cross-sectional view of the TFT array panel shown in FIG. 11 taken along line XII-XII'.

FIGS. 3, 5, 7, 9 and 11 are layout views of the organic TFT array panel shown FIGS. 1 and 2 in intermediate steps of a manufacturing method thereof according to an embodiment of the present invention, FIG. 4 is a cross-sectional view of the TFT array panel shown in FIG. 3 taken along line IV-IV', FIG. 6 is a cross-sectional view of the TFT array panel shown in FIG. 5 taken along line VI-VI', FIG. 8 is a cross-sectional view of the TFT array panel shown in FIG. 7 taken along line VIII-VIII', FIG. 10 is a cross-sectional view of the TFT array panel shown in FIG. 9 taken along line X-X', and FIG. 12 is a cross-sectional view of the TFT array panel shown in FIG. 11 taken along line XII-XII'.

Referring to FIGS. 3 and 4, a conductive layer preferably made of Cr and having a thickness of about 2,000 Å is deposited on a substrate 110 and patterned by lithography and etch to form a plurality of data lines 171 including end portions 179.

Referring to FIGS. 5 and 6, an interlayer insulating film 160 preferably made of SiNx and having a thickness of about 2,000 Å is deposited. Thereafter, a conductive layer, which may include a lower Al—Nd film having a thickness of about 1,500 Å and an upper Mo film of about 300 Å, is deposited on the interlayer insulating film 160 and patterned by lithography and etch to form a plurality of gate lines 121 including gate electrodes 124 and end portions 129.

Referring to FIGS. 7 and 8, a gate insulating layer 140 having a thickness of about 8,000 Å is deposited and the gate insulating layer 140 and the interlayer insulating film 160 are patterned to form a plurality of contact holes 141, 142 and 143 exposing the end portions 129 of the gate lines 121, the end portions 179 of the data lines 171, and portions of the data lines 171, respectively.

Referring to FIGS. 9 and 10, an ITO layer having a thickness of about 400 Å is deposited on the gate insulating layer 140 and patterned by lithography and etch to form a plurality of source electrodes 193, a plurality of pixel electrodes 190 including drain electrodes 195, and a plurality of contact assistants 81 and 82.

The deposition of the ITO layer may be performed at a room temperature ranging about 20–35° C. such that the sputtered ITO layer is an amorphous phase and has uniform film quality from the bottom to the top. The etching of the amorphous ITO layer may be made by wet etching preferably with a Cr etchant containing $HNO_3$, $(NH_4)_2Ce(NO_3)_6$, and $H_2O$, which is used for etching Cr and hardly affect the surface of the gate insulating layer 140 since it includes no hydrochloric acid. Annealing for converting the amorphous ITO into quasi-crystalline amorphous ITO may be added after the ITO layer is etched and the annealing may be performed at a temperature higher than about 180° C. for about one to three hours. The quasi-crystalline amorphous ITO may provide excellent contact characteristics with an organic gate insulating layer 140.

Referring to FIGS. 11 and 12, a plurality of organic semiconductor islands 154 preferably made of pentacene and having a thickness of about 800 Å and a plurality of stoppers 164 are formed by molecular beam deposition, vapor deposition, vacuum sublimation, CVD, PECVD, reactive deposition, sputtering, spin coating, contact printing, inkjet printing, etc. with or without shadow mask.

Finally, an insulating layer having a thickness less than about one micron is deposited and patterned to form a plurality of passivation members 180 as shown in FIGS. 1 and 2. The stoppers 164 protect the organic semiconductor islands 154 to prevent the organic semiconductor islands 154 from being damaged during the formation of the passivation members 180.

As described above, the data lines 171, the gate lines 121, the source electrodes 193, and the pixel electrodes 190 are formed before the organic semiconductor islands 154 are formed. Accordingly, the organic semiconductor islands 154 can avoid the damage caused by the formation of the elements 171, 121, 193 and 190, thereby securing the characteristics of the organic TFTs.

In addition, since the gate insulating layer 140 is formed after the data lines 171 and the gate lines 121 are formed, the gate insulating layer 140 can avoid the degradation of its surface characteristics that is important to the characteristics of the organic TFTs.

Now, an organic TFT according to another embodiment of the present invention will be described in detail with reference to FIGS. 13 and 14.

Figure 13:
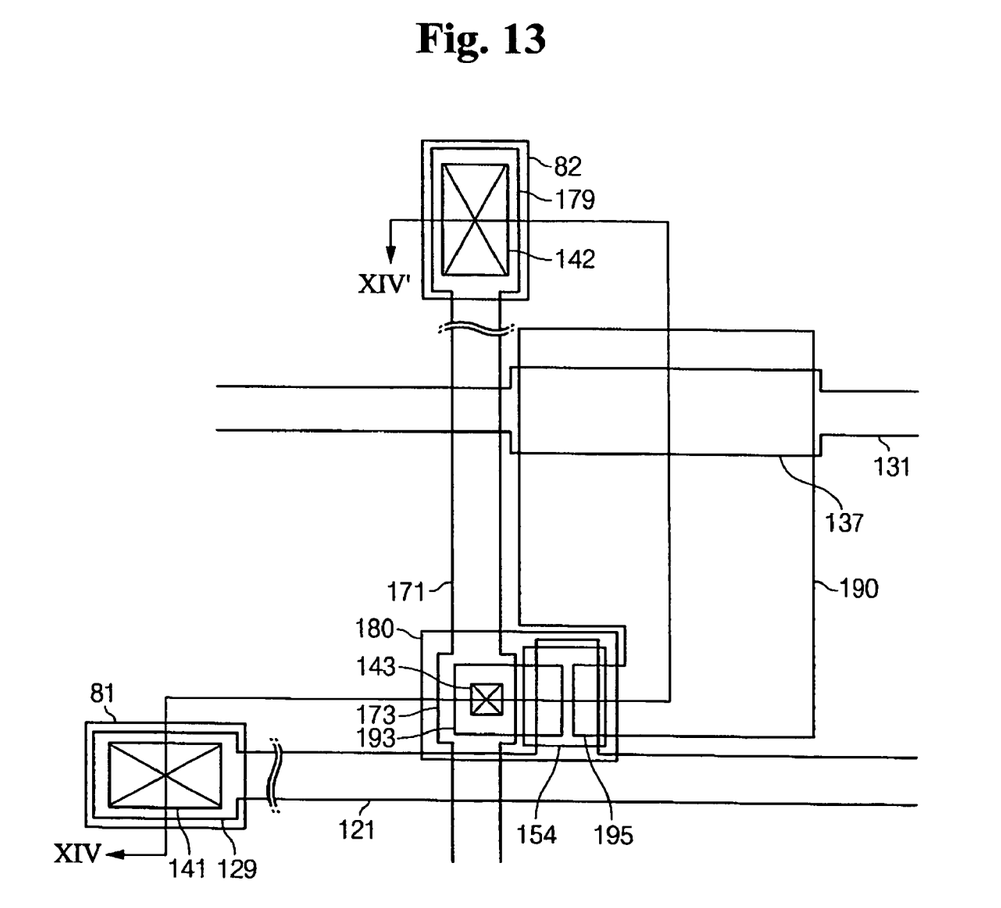
FIG. 13 is a layout view of an organic TFT array panel according to another embodiment of the present invention.
Figure 14:
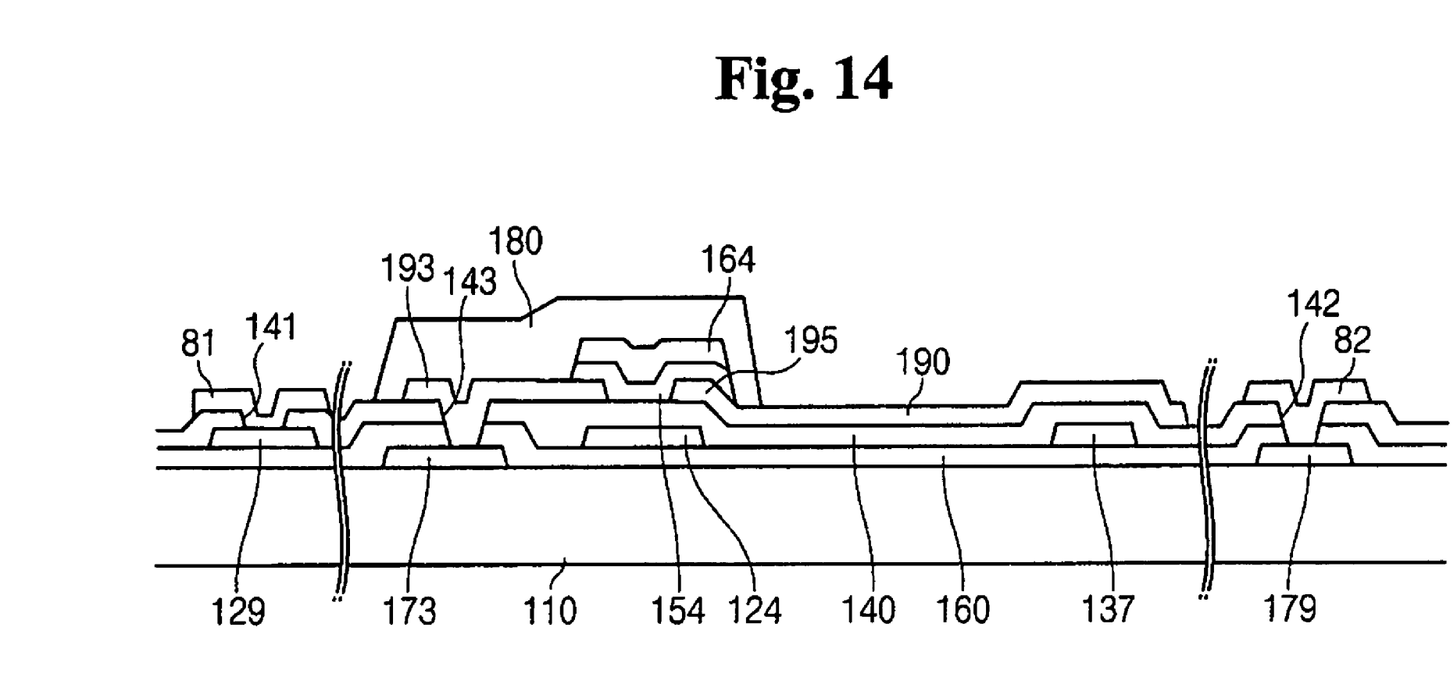
FIG. 14 is a cross-sectional view of the organic TFT array panel shown in FIG. 13 taken along line XIV-XIV'.

FIG. 13 is a layout view of an organic TFT array panel according to another embodiment of the present invention, and FIG. 14 is a cross-sectional view of the organic TFT array panel shown in FIG. 13 taken along line XIV-XIV'.

As shown in FIGS. 13 and 14, a layered structure of the organic TFT array panel according to this embodiment is almost the same as that shown in FIGS. 1 and 2.

That is, a plurality of data lines 171 including end portions 179 are formed on a substrate 110, and an interlayer insulating film 160 is formed thereon. A plurality of gate lines 121 including gate electrodes 124 and end portions 129 are formed on the interlayer insulating film 160 and a gate insulating layer 140 is formed thereon. The gate insulating layer 140 has a plurality of contact holes 141 and the gate insulating layer 140 and the interlayer insulating film 160 have a plurality of contact holes 142 and 143. A plurality of source electrodes 193, a plurality of pixel electrodes 190, and a plurality of contact assistants 81 and 82 are formed on the gate insulating layer 140 and a plurality of organic semiconductor islands 154, a plurality of stoppers 164, and a plurality of passivation members 164 are sequentially formed thereon.

Unlike the organic TFT array panel shown in FIGS. 1 and 2, a storage electrode line 131 is formed on the interlayer insulating film 160. The storage electrodes 131 are supplied with a predetermined voltage and extend substantially parallel to the gate lines 121. Each storage electrode 131 is disposed between two adjacent gate lines 121 and includes an expansion 137 expanding upward and downward. However, the storage electrode lines 131 may have various shapes and arrangements.

The expansions 137 of the storage electrode lines 131 overlap the pixel electrode 190 to form additional capacitors referred to as "storage capacitors," which enhance the voltage storing capacity of the liquid crystal capacitors.

The data lines 171 are expanded near the contact holes 143 and the drain electrodes 195 project from the pixel electrodes 190.

Many of the above-described features of the organic TFT array panel and the manufacturing method thereof shown in FIGS. 1–12 may be appropriate to the organic TFT array panel shown in FIGS. 13 and 14 and the manufacturing method thereof.

In the above-described embodiments of the present invention, the organic semiconductor islands 154 and the gate insulating layer 140 is minimally exposed to lithography and etch to secure the characteristics of the organic TFTs. In addition, the gate insulating layer 140 contacts the source electrodes 193 and the pixel electrodes 190 preferably made of ITO, the contact characteristics of the gate insulating layer 140 is preserved.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An organic thin film transistor array panel comprising:
   a substrate;
   a data line disposed on the substrate;
   an interlayer insulating layer disposed on the data line;
   a gate line disposed on the interlayer insulating layer and including a gate electrode;
   a gate insulating layer disposed on the gate line and the interlayer insulating layer, the gate insulating layer and the interlayer insulating film having a contact hole exposing the data line;
   a first electrode disposed on the gate insulating layer and connected to the data line through the contact hole;
   a second electrode disposed opposite the first electrode with respect to the gate electrode;

an organic semiconductor disposed on the first electrode and the second electrode and contacting the first electrode and the second electrode; and a passivation member disposed on the organic semiconductor.

2. The organic thin film transistor array panel of claim 1, wherein the first electrode and the second electrode comprise ITO.

3. The organic thin film transistor array panel of claim 2, wherein the second electrode comprises a pixel electrode.

4. The organic thin film transistor array panel of claim 1, further comprising an insulator disposed between the organic semiconductor and the passivation member.

5. The organic thin film transistor array panel of claim 4, wherein the insulator comprises a fluorine containing hydrocarbon based polymer or a parylene.

6. The organic thin film transistor array panel of claim 1, wherein the interlayer insulating film comprises silicon nitride ($SiN_x$), polyacryl, polyimide, or benzocyclobutene.

7. The organic thin film transistor array panel of claim 1, wherein the gate insulating layer comprises at least one selected from the group consisting of silicon dioxide, silicon nitride, maleimide-styrene, polyvinylphenol (PVP), and modified cyanoethyl pullulan (m-CEP).

8. The organic thin film transistor array panel of claim 1, wherein the organic semiconductor comprises at least one selected from the group consisting of:
   tetracene, pentacene, and derivatives thereof with substituent;
   oligothiophene including four to eight thiophenes connected at the positions 2, 5 of thiophene rings;
   perylenetetracarboxylic dianhydride (PTCDA), naphthalenetetracarboxylic dianhydride (NTCDA), and imide derivatives thereof;
   metallized phthalocyanine and halogenated derivatives thereof;
   co-oligomer and co-polymer of thienylene and vinylene;
   regioregular polythiophene;
   perylene, coronene, and derivatives thereof with substituent; and
   aromatic and heteroaromatic ring of the above-described materials with at least one hydrocarbon chain having one to thirty carbon atoms.

9. A method for manufacturing an organic thin film transistor array panel, the method comprising:
   forming a data line on a substrate;
   forming an interlayer insulating film on the data line;
   forming a gate line on the interlayer insulating film;
   forming a gate insulating layer on the gate line and the interlayer insulating film, the gate insulating layer and the interlayer insulating film having a contact hole exposing the data line;
   forming a first electrode and a second electrode on the gate insulating layer, the first electrode connected to the data line through the contact hole and the second electrode separated from the first electrode;
   forming an organic semiconductor on the first electrode and the second electrode and which contacts the first electrode and the second electrode; and
   forming a passivation member on the organic semiconductor.

10. The method of claim 9, further comprising:
    forming an insulator on the organic semiconductor and under the passivation member.

11. The method of claim 9, wherein the first electrode and the second electrode comprises ITO.

12. The method of claim 10, wherein forming an insulator on the organic semiconductor and under the passivation member comprises:
    forming an insulator comprising a fluorine containing hydrocarbon based polymer or a parylene on the organic semiconductor and under the passivation member.

13. An organic thin film transistor array panel comprising:
    a substrate;
    a data line disposed on the substrate;
    an interlayer insulating layer disposed on the data line;
    a gate line disposed on the interlayer insulating layer and including a gate electrode;
    a gate insulating layer disposed on the gate line and the interlayer insulating layer, the gate insulating layer and the interlayer insulating film having a contact hole exposing the data line;
    a first electrode disposed on the gate insulating layer and connected to the data line through the contact hole;
    a second electrode disposed opposite the first electrode with respect to the gate electrode;
    an organic semiconductor disposed on the first and second electrodes and contacting the first and second electrodes; and
    a passivation member disposed on the organic semiconductor, and wherein the first and second electrodes comprise ITO.

14. The organic thin film transistor array panel of claim 13, wherein the second electrode comprises a pixel electrode.

* * * * *